US007016383B2

(12) United States Patent
Rice

(10) Patent No.: US 7,016,383 B2
(45) Date of Patent: Mar. 21, 2006

(54) IMMERSION-COOLED MONOLITHIC LASER DIODE ARRAY AND METHOD OF MANUFACTURING THE SAME

(75) Inventor: Robert R. Rice, Simi Valley, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 225 days.

(21) Appl. No.: 10/648,265

(22) Filed: Aug. 27, 2003

(65) Prior Publication Data

US 2005/0047456 A1    Mar. 3, 2005

(51) Int. Cl.
*H01S 5/24*    (2006.01)
(52) U.S. Cl. .......................... 372/36; 438/122
(58) Field of Classification Search ............ 372/36
See application file for complete search history.

(56) References Cited

U.S. PATENT DOCUMENTS

| 4,998,803 | A |   | 3/1991 | Salour et al. |   |
|---|---|---|---|---|---|
| 5,040,187 | A | * | 8/1991 | Karpinski | 372/50 |
| 5,128,951 | A |   | 7/1992 | Karpinski |   |
| 5,284,790 | A |   | 2/1994 | Karpinski |   |
| 5,311,535 | A |   | 5/1994 | Karpinski |   |
| 5,495,490 | A |   | 2/1996 | Rice et al. |   |
| 5,526,373 | A |   | 6/1996 | Karpinski |   |
| 5,548,605 | A | * | 8/1996 | Benett et al. | 372/36 |
| 5,668,825 | A |   | 9/1997 | Karpinski |   |
| 5,764,675 | A |   | 6/1998 | Juhara |   |
| 6,101,206 | A | * | 8/2000 | Apollonov et al. | 372/50 |
| 6,240,116 | B1 | * | 5/2001 | Lang et al. | 372/50 |
| 6,400,740 | B1 |   | 6/2002 | Karpinski |   |
| 6,480,515 | B1 |   | 11/2002 | Wilson |   |

FOREIGN PATENT DOCUMENTS

EP    0 436 380 A2    7/1991

OTHER PUBLICATIONS

Endriz, et al. "High Power Diode Laser Arrays," *IEEE Journal of Quantum Electronics,* New York, vol. 28, No. 4, Apr. 1, 1992, pp. 952-965.

Mundinger, et al. "Demonstration of High-Performance Silicon Microchannel Heat Exchangers for Laser Diode Array Cooling," *Applied Physics,* New York, vol. 53, No. 12, Sep. 19, 1988, pp. 1030-1032.

* cited by examiner

*Primary Examiner*—James Vannucci
(74) *Attorney, Agent, or Firm*—Posz Law Group, PLC

(57) ABSTRACT

A laser diode array is formed on a substrate (310) in which a number of parallel grooves (312) are formed. A metal layer (410) is formed on the grooves (312). Laser diode bars (314) are fitted in alternate grooves, and every other groove is left vacant to serve as a cooling channel (316). The array is immersion cooled in a housing (210). Liquid coolant is circulated through the housing (210) and through a heat exchanger (216). The liquid coolant flows over a major surface of the substrate (310) and through the cooling channels (316). Thus, heat is removed by circulating fluid from three sides of the laser diode bars (314). Such high-performance cooling permits the laser diode array to have a greater power density.

18 Claims, 4 Drawing Sheets

US 7,016,383 B2

IMMERSION-COOLED MONOLITHIC LASER DIODE ARRAY AND METHOD OF MANUFACTURING THE SAME

BACKGROUND OF THE INVENTION

This invention relates to laser diode pump arrays, and more particularly to liquid cooling of laser diode pump arrays.

Typically, the emitted power density of laser diode pump arrays is inadequate, they are expensive, and they are often unreliable. A monolithic laser diode array disclosed in U.S. Pat. No. 5,040,187 to Karpinski is relatively inexpensive and reliable and can use monolithic lens arrays, which improves lens attachment. However, the power density is limited to about 100–200 W/cm$^2$ due to thermal impedance. On the other hand, a liquid cooled laser diode array apparatus disclosed in U.S. Pat. No. 5,495,490 to Rice et al. provides improved cooling performance and higher power density. However, the apparatus of Rice et al. does not have the lower cost, high reliability and lens attachment advantages of the monolithic laser diode array. Thus, there is a need for a low cost laser diode pump array that achieves high power density and high reliability at a low cost.

SUMMARY OF THE INVENTION

Accordingly, an object of the present invention is to provide an inexpensive and reliable laser diode array that provides a high power density.

It is another object of the invention to provide laser diode arrays that can be manufactured in high volume with high reliability at relatively low cost.

To achieve the foregoing and other objects, the invention is basically a laser diode apparatus including a substrate having first and second major surfaces. A plurality of grooves is formed in the first major surface of the substrate. At least a first one of the plurality of grooves serves as a cooling channel through which coolant flows to cool the substrate. The apparatus further includes a laser diode bar located in at least a second one of the plurality grooves, and the first groove is in close proximity to the second groove.

In another aspect of the invention, a metallization layer is formed on side walls of the second groove.

In another aspect of the invention, a metallization layer is formed on walls defining the first groove.

In another aspect of the invention, the first groove is one of a plurality of grooves serving as cooling channels through which coolant flows to cool the substrate, and the second groove is one of a plurality of grooves in which laser diode bars are respectively located.

In another aspect of the invention, the grooves that form cooling channels are parallel to the grooves in which laser diode bars are respectively located, and the grooves that form cooling channels are alternated with the grooves in which laser diode bars are respectively located.

In another aspect of the invention, the laser diode apparatus is surrounded by a housing, and the housing includes a window that is opposed to an emitting face of the laser diode bar.

In another aspect of the invention, a space exists between the laser diode apparatus and the housing, and coolant flows through the space, and the space communicates with the cooling channel.

In another aspect of the invention, an inlet is formed in the housing to conduct coolant into the housing, and an outlet is formed in the housing for permitting coolant to exit the housing.

In another aspect of the invention, the inlet is located on a first side of the housing, and the outlet is located on a second side of the housing, which is opposite to the first side of the housing, and the substrate is arranged in the housing such that the grooves extend from the first side of the housing to the second side of the housing and such that the cooling channel is aligned with the direction of coolant flow.

DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
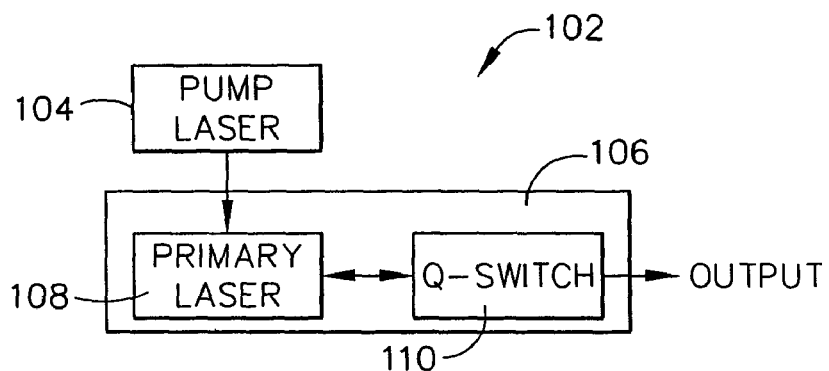
FIG. 1 is a block diagram showing the laser diode array of the present invention coupled to a primary laser, which is in turn coupled to a Q-switch.

Referring now to FIG. 1, a laser system 102, which is adapted to provide a laser output having a relatively high output power level, is illustrated in block diagram form. In particular, the laser system 102 includes a pump laser, or laser pump source 104, for emitting laser pulses. The laser output has a relatively high average power level. For example, the laser pump source can be a two-dimensional laser diode array that has an average power level of 1500 W/cm$^2$.

The laser output emitted by the laser pump source 104 is typically applied to a primary laser 108, such as a slab laser, a rod laser or a fiber laser. For example, the primary laser can be a Nd:YAG slab laser. The output of the primary laser can, in turn, be controlled by a Q-switch 110 if a pulsed output is desired. As known to those skilled in the art, the Q-switch induces the primary laser to emit short pulses with high peak power. Alternatively, in embodiments in which the laser system 102 does not include a Q-switch, the primary laser will generally operate either continuously or in a long pulse mode. If included, the Q-switch 110 defines, at least in part, the primary laser cavity 106 and controls the output of the primary laser 108 such that only laser output having a power level above a predetermined threshold level is generated.

The laser pump source 104 need not be coupled to another laser. That is, the laser output from the laser pump source 104 can be used directly depending on the desired application.

Figure 2:
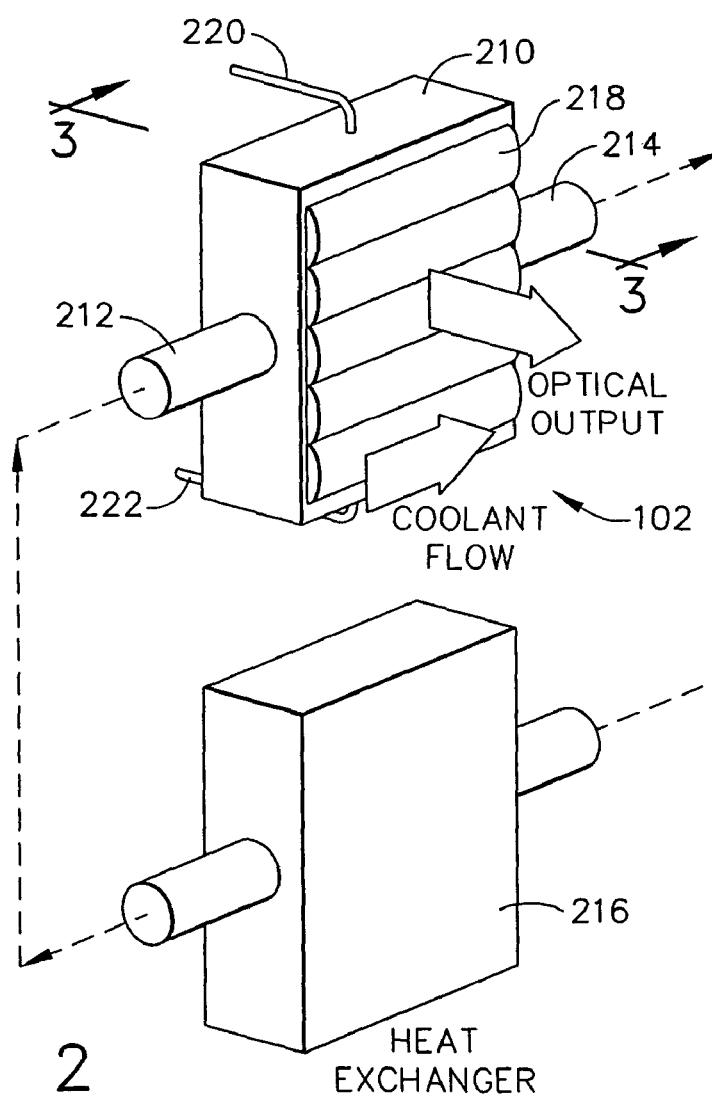
FIG. 2 is a diagrammatic perspective view showing the laser diode array of the present invention connected to a heat exchanger.
Figure 3:
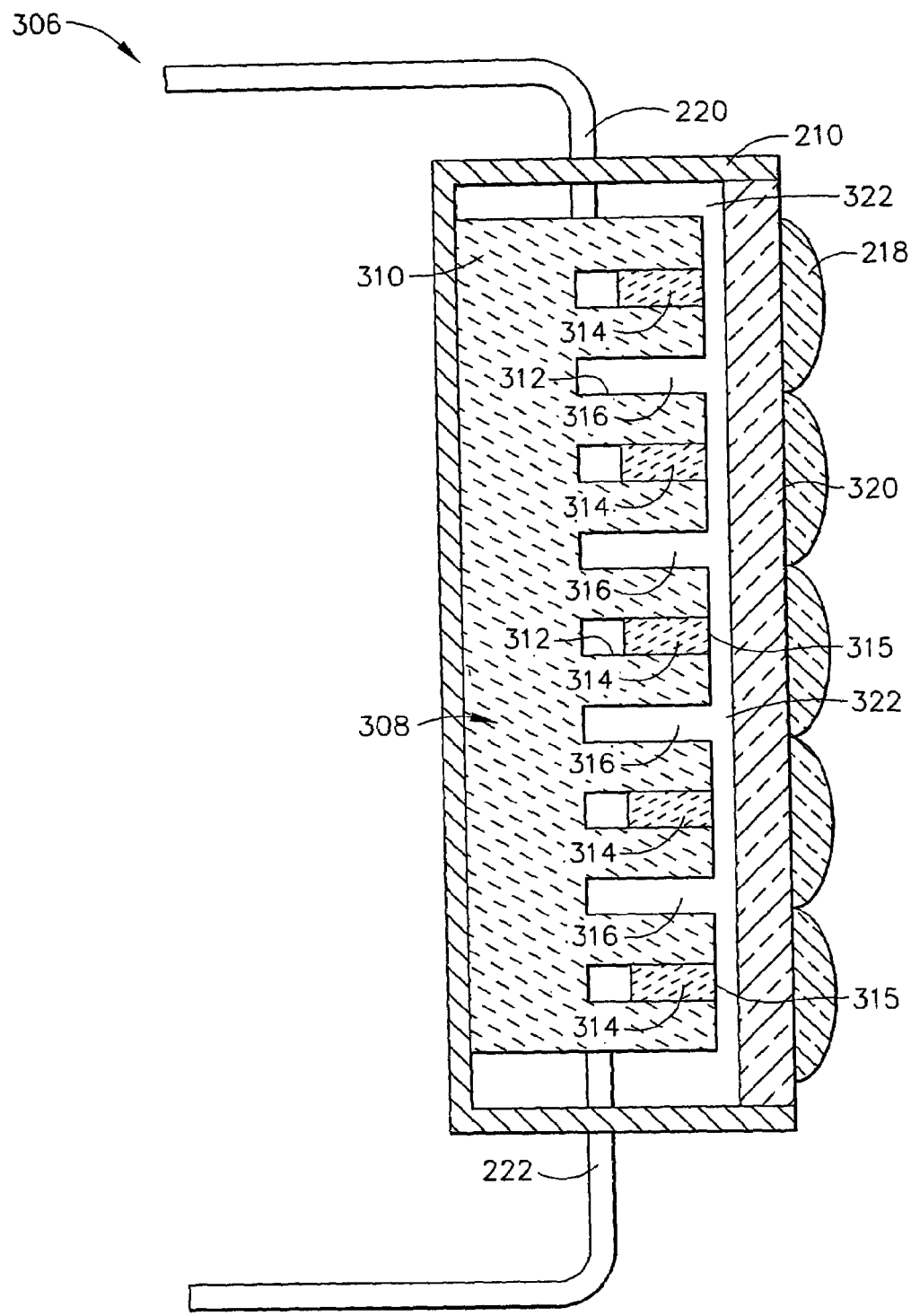
FIG. 3 is a cross sectional view taken along the plane indicated by the line 3—3 in FIG. 2.
Figure 4:
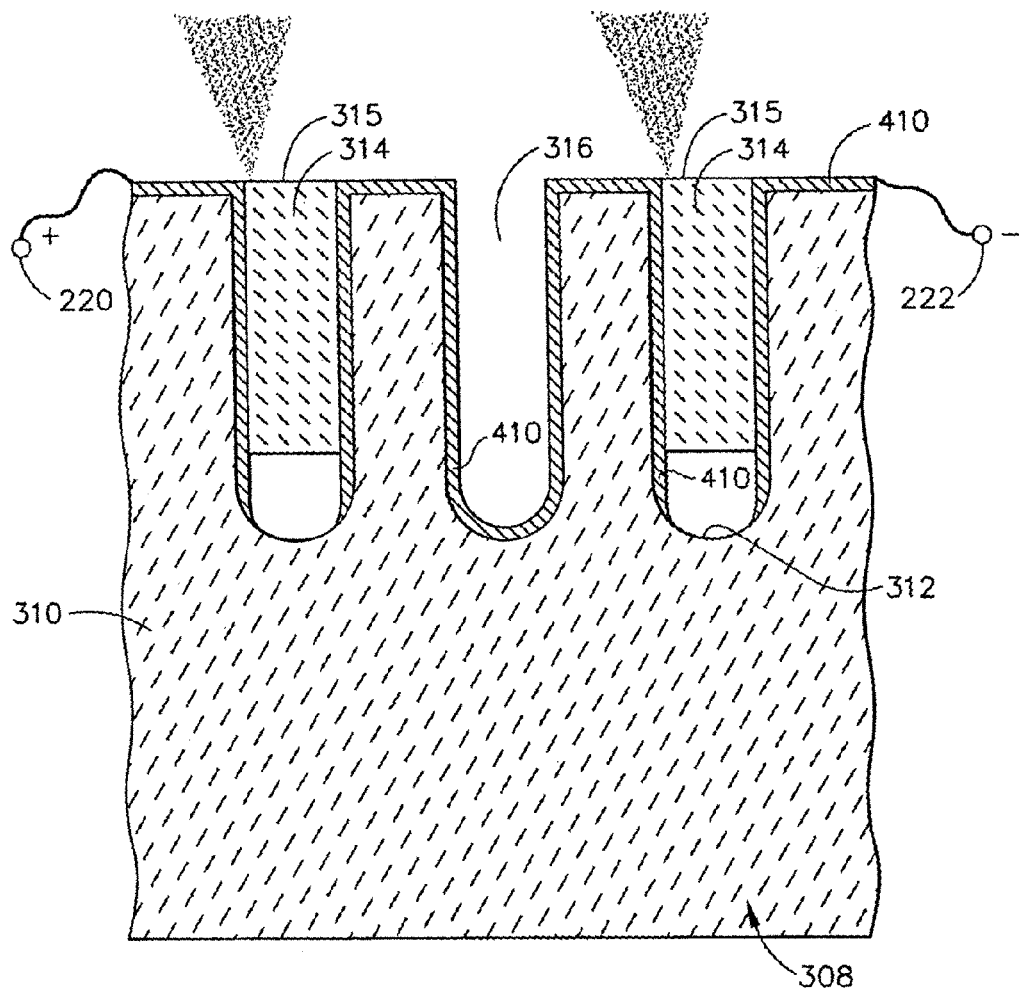
FIG. 4 is an enlarged cross sectional view and is an enlargement of a portion of FIG. 3 that has been rotated such that the major surface of the substrate faces upward.

According to the present invention, referring to FIGS. 3 and 4, the laser pump source 104 is a semiconductor laser assembly 306 including a semiconductor laser device 308. In one preferred embodiment, the semiconductor laser device 308 includes a linear array of laser diodes, or diode bars 314, and, more preferably, includes a plurality diode bars 314 configured as a two-dimensional laser diode array. For example, one embodiment of the semiconductor laser device 308 of the present invention, which includes a two-dimensional laser diode array, is illustrated in FIGS. 2 and 3. As known to those skilled in the art, the individual diode bars 314 of the semiconductor laser device 308 are preferably electrically connected such that the output of the laser diode array is synchronized.

The diode bars that form the semiconductor laser device 308 can be fabricated of any of several semiconductor materials known to those skilled in the art. For example, the diode bars 314 can be comprised of AlGaAs, InGaAs, or GaInAsP. The diode bars 314 can be comprised of other materials known to those skilled in the art and may be commercially available laser diode bars. One such laser diode bar is manufactured by NorthEast Semiconductor, Inc. Each diode bar includes a plurality of individual emitters, for example, 30 emitters per centimeter. Each diode bar has an emitting face, which is the right face in FIG. 3 and the upward face in FIG. 4, in a manner well understood by those of ordinary skill in the art.

Referring to FIGS. 3 and 4, a monolithic substrate 310 is, for example, approximately 2 cm×1 cm×0.3 cm. Of course, other sizes may be provided, depending on the desired application. For example, a substrate that is 5 cm×5 cm×0.3 cm may be used. The thickness of the substrate 310 also may vary. Depending on manufacturing considerations, the first formed substrate may be relatively large, and then may be cut into smaller arrays, or submounts, at an appropriate step in the fabrication process.

The substrate 310 may be formed of BeO (which may be small grain BeO), AlN, undoped silicon, isotopically pure silicon 28, or any highly thermally conductive material, preferably ceramic. Isotopically pure silicon 28 is one of the preferred materials for the substrate 310 due to its high conductivity, which is comparable to copper.

The substrate 310 may be polished on both sides to a 3 to 4 $\mu$m finish, and the overall thickness is reduced to 3 mm. Grooves 312 are formed approximately 1.5 mm deep and 100 microns wide, along the second of the above-mentioned dimensions. However, the groove dimensions can vary depending on the desired performance characteristics. The grooves 312 may be wider at the top than at the bottom, depending on manufacturing conditions. The grooves 312 may be provided with a rounded bottom as shown in FIG. 4. The grooves 312 shown in FIGS. 3 and 4 preferably have substantially the same dimensions and are spaced apart at equal intervals to facilitate manufacturing. In FIGS. 3 and 4, a 200 micron separation between adjacent grooves is provided and a 100 micron margin is provided on either side. Thus, for a substrate that is 1 cm wide, 50 grooves may be cut. However, it should be understood that the design is not limited to these dimensions. The grooves 312 may be farther apart or closer together, as required by the end user of the laser diode array 308. The grooves are formed using conventional semiconductor manufacturing techniques, such as sawing or etching.

Some of the grooves 312 will hold laser diode bars 314 and some will serve as cooling channels 316. However, the grooves that serve as cooling channels are preferably identical to those that serve to hold laser diode bars 314 for manufacturing efficiency. That is, the cooling channels 316 are formed by simply leaving some of the grooves 312 empty, and no additional manufacturing steps are required to form the cooling channels 316.

Referring to FIG. 4, which is an enlarged view of a portion of FIG. 3, a metal layer 410 is provided, using one or more of Cr, Ti, Ni, Au, or Ag, alloys thereof, or any suitably conductive material that adheres sufficiently to the substrate, with a standard metal evaporator or any other suitable plating technique, such as that used in the fabrication of printed circuit boards. Generally, the practice is to use various combinations of the above-mentioned materials. For example, Cr or Ti may be used first, because they bond well to the substrate material (which usually is ceramic). Then, a thick layer of Ni may be applied, to handle the current that will flow through the metallization layer. Then, a layer of gold (Au) may be provided, because it may be used to form thermocompression bonds.

Metallization of the substrate decreases the size of the grooves 312. According to one preferred embodiment, the metallized grooves 312 may be perhaps a few microns smaller than the corresponding thickness of the laser diode bars 314 to be inserted. According to another preferred embodiment, the metallized grooves 312 may be slightly larger than the corresponding thickness of the laser diode bars 314.

In the preferred and illustrated embodiment, the metallization is removed from the bottom of every other groove by shadowing or masking or sawing, which are well-known techniques in order to provide electrical isolation. That is, the metal layer 410 is removed from the bottoms of the grooves 316 in which the diode bars 314 will be installed so that voltage is properly applied to the diode bars 314 in a manner well understood in the art. The grooves 312 that are adjacent to the diode bars 314 remain empty and serve as the cooling channels 316. However, the metal layer 410 must remain in the cooling channels 316 to conduct electricity to the diode bars 314 in the adjacent grooves 312. Hence, the diode bars 314 are electrically in series. Alternatively, if the cooling channels 316 are not metallized, electricity must be conducted to the grooves 316 in which the diode bars 314 are located by another conductor such as a metal foil (not shown) spanning each cooling channel 316.

Once the metallization step has been performed, metallized substrates 308 are sized and isolated to form arrays of a suitable size. For example, a 5 cm×5 cm array may be cut into individual 1 cm$^2$ arrays. Once this step is accomplished, the laser diode bars 314 may be loaded into each array using methods known to those of ordinary skill in the art. For example, if the grooves 312 are narrower than the diode bars 314, then the substrate 310 may be flexed to temporarily enlarge the grooves 312 to permit insertion of the diode bars 314 into alternate grooves 312. In the preferred and illustrated embodiment, every other groove 312 is left vacant to serve as a cooling channel 316.

As also illustrated in FIGS. 2, 3 and 4, the semiconductor laser device 308 of the present invention includes first and second electrodes 220, 222, which are electrically connected to the semiconductor laser device 308, for supplying electrical energy to the semiconductor laser device 308. Upon sufficient electrical actuation, the semiconductor laser device 308 emits a laser output through an emitting face, or front face, of the semiconductor laser device 308 and, more particularly, through the respective emitting or front faces 315 of the individual laser diode bars 314. As shown in FIG. 4, each electrode 220, 222 is electrically connected to a respective side of the metallization layer 410.

During the emission of the laser output, the semiconductor laser device 308 generates heat, which increases the temperature of the semiconductor laser device 308 in the absence of cooling. In order to maintain the temperature of the semiconductor laser device 308 safely below a predetermined maximum operating temperature, to prevent damage to the laser device 308, and to permit a higher output, the semiconductor laser device 308 is immersion cooled in circulating fluid.

Liquid coolant circulates about the electrically activated semiconductor laser device 308. Preferably, the liquid coolant flows about and directly contacts the emitting faces 315, or front faces, of the laser diode bars 314 and through the cooling channels 316. The liquid coolant has a temperature that is lower than the temperature of the semiconductor laser device 308 during the emission of the laser output. Accordingly, the circulation of liquid coolant about the semiconductor laser device 308 draws heat from and, consequently, cools the laser device 308.

The liquid coolant is preferably a dielectric liquid which is both electrically and optically passive. Accordingly, the liquid coolant is transparent at the predetermined range of wavelengths at which the semiconductor laser device 308 emits a laser output. In addition, the liquid coolant does not absorb the laser emissions within the predetermined range of wavelengths such that the output power level produced by the semiconductor laser device 308 is not attenuated or diminished by the circulating liquid coolant. In one embodiment, the dielectric liquid coolant is a fluorinert compound, such as FC75 or FC77. In another embodiment, the dielectric liquid coolant is a light hydrocarbon compound, such as hexane. In yet another embodiment, the dielectric liquid coolant is freon, anhydrous ammonia or a silicon-based liquid.

By directly contacting the semiconductor laser device 308 and, more particularly, by directly contacting the emitting faces of the semiconductor laser diode bars 314 with coolant, the thermal impedance of the semiconductor laser assembly 308 is reduced. In addition, the direct contact of the liquid coolant with the emitting faces of the individual laser diode bars 314 of the semiconductor laser device 308 improves the cooling of the emitting faces such that the semiconductor laser device 308 can be operated at relatively high temperatures without damaging the emitting faces of the laser diode bars 314. Accordingly, the operating lifetime of the semiconductor laser device 308 is increased. Further, the immersion of the semiconductor laser device and, in particular, the immersion of the emitting faces 315 of the semiconductor laser device 308 in the liquid coolant significantly reduces the risk of the emitting faces of the semiconductor laser device 308 being exposed to external contamination. In addition, coolant flows through the cooling channels 316, which permits heat to be removed laterally, from the sides of the diode bars 314. Thus, such high performance cooling permits the laser device 308 to have a very high power density and a relatively high output, and the semiconductor laser device 308 can be operated continuously without incurring heat-related damage.

The semiconductor laser assembly 306 of the present invention also preferably includes a housing 210 in which the semiconductor laser device 308 and the first and second electrodes 220, 222 are located. As shown in FIG. 3, the housing 210 includes a front window 320. The laser output of the semiconductor laser device 308 is emitted through the window 320. Thus, the housing 210 fully encloses the laser device 308. The window is made of material that is transparent to light in the range of wavelengths emitted by the semiconductor laser device 308. For example, the window can be comprised of glass, fused silicon, or sapphire. However, the window 320 can be comprised of other materials without departing from the spirit and scope of the present invention.

As shown in FIG. 3, semi-cylindrical lenses 218 are joined to the window 320. Alternatively, the lenses 218 and the window 320 may be a single integral member formed by molding, for example.

A space 322, which communicates with the cooling channels 316, exists between the laser device 308 and the housing 210. The space is filled with moving liquid coolant of one of the above-mentioned exemplary types during operation of the laser assembly 306. The semiconductor laser device 308 is located within the housing 210 such that the emitting faces of the semiconductor laser device 308 are adjacent the window 320 in a predetermined spaced-apart relationship. As best shown in FIG. 3, liquid coolant circulates between the window 320 and the semiconductor laser device 308, through the cooling channels 316, and, in addition, between the sides of the semiconductor laser device 308 and the walls of the housing 210 to transfer heat from and cool the semiconductor laser device 308. As shown in FIG. 2, a heat exchanger 216 is connected to an inlet 212 and an outlet 214 to form a coolant circuit. The heat exchanger 216 cools the liquid coolant in a manner well understood by those of ordinary skill in the art.

Although FIG. 2 shows the inlet 212 and the outlet 214 as being round, it is preferred that the inlet extend along the entire length of the laser device 308, such that the flow of coolant is approximately the same in each of the coolant channels 316 and is substantially uniform across the front face of the laser device 308. This may be accomplished with a manifold or by shaping the inlet 212 and the outlet 214 in a desired manner, as well understood in the art. It is preferred that the coolant channels 316 be arranged to extend longitudinally from the inlet 212 to the outlet 214 to facilitate coolant flow through the cooling channels 316.

Figure 5:
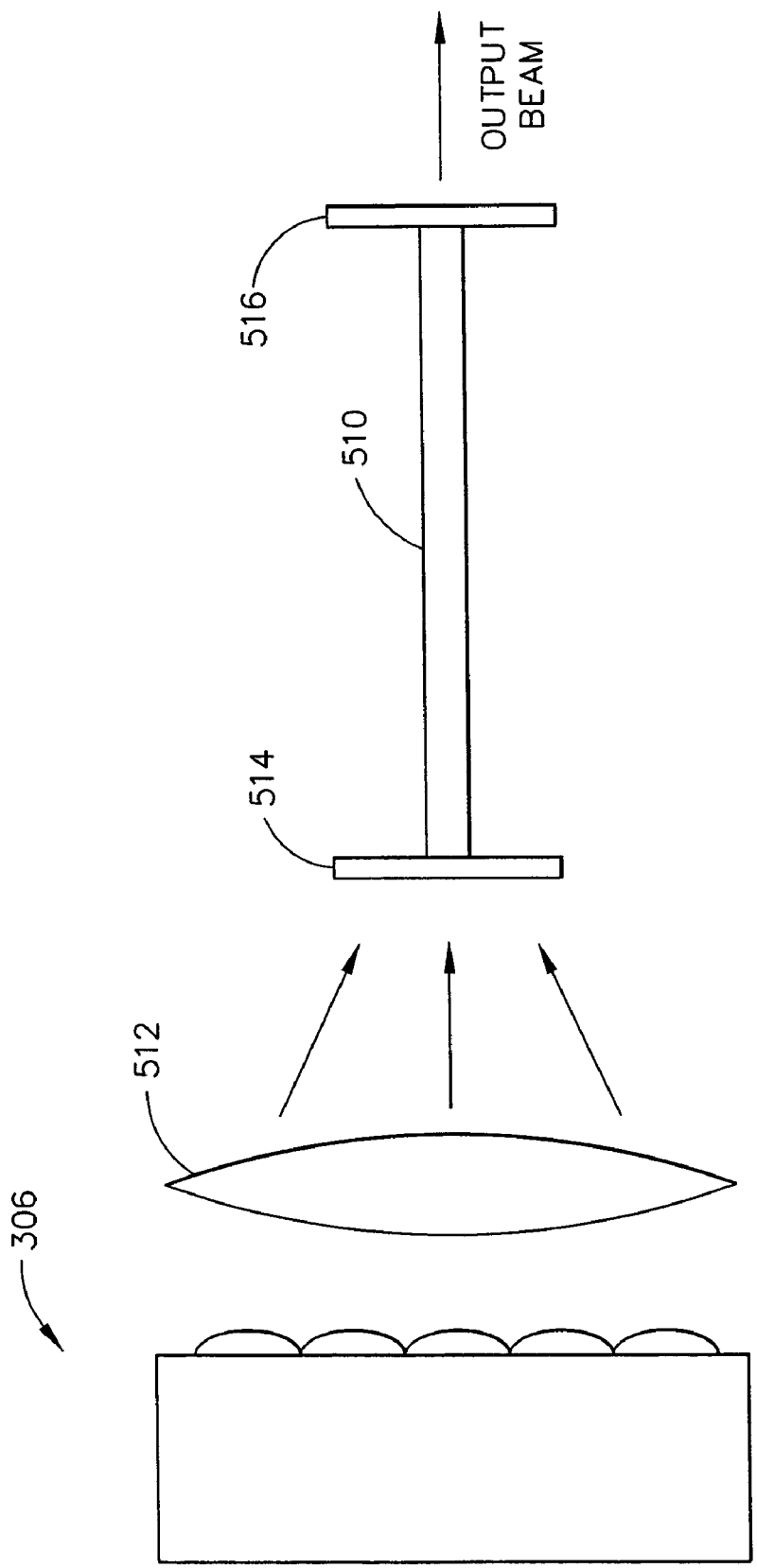
FIG. 5 is a diagrammatic side view of the laser diode array of the present invention coupled to a fiber laser through a coupling lens.

FIG. 5 shows an application of the immersion cooled laser diode assembly 306 in which the laser output of the semiconductor laser assembly 306 is directed to a dual-clad fiber 510 of conventional construction to form a fiber laser. For simplicity, the heat exchanger and coolant circuit are not shown in FIG. 5; however it is understood that the semiconductor laser assembly 306 of FIG. 5 is liquid cooled in the manner illustrated in FIG. 2. A coupling lens 512 is located in front of the semiconductor laser assembly 306 to focus the light output of the semiconductor laser assembly 306 to one end of the fiber 510. A high reflectivity mirror 514 is located at the input end of the fiber 510, and an output mirror 516 is located at the output end of the fiber 510. An output beam is emitted from the output end of the fiber 510. Since the semiconductor laser assembly 306 is immersion cooled and includes the cooling channels 316, the power density of the semiconductor laser assembly 306 may relatively high, which permits the area of the face of the semiconductor laser assembly 306 to be smaller and the coupling lens 512 may be smaller for a device of a given power. Further, the laser diode device 306 may be operated continuously, rather than intermittently, due to the high performance cooling provided by the cooling channels 316.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A laser diode apparatus comprising:
a substrate having first and second major surfaces;
a plurality of substantially identical, parallel grooves formed in the first major surface of the substrate, wherein
each of the grooves has a pair of opposed, parallel side walls and an opening formed in the major surface, and the sidewalls are perpendicular to the major surface and extend from the major surface to bottoms of the grooves,
the grooves include at least one heat-emitting groove and at least a pair of cooling grooves, and each of the cooling grooves is open and defines a coolant space that is adapted to accommodate cooling fluid to cool the substrate; and
a laser diode bar located in the heat-emitting groove, wherein
the laser diode bar has a first side, which is parallel to the side walls of the heat-emitting groove, and a second side, which is opposite to and parallel to the first side;
the heat-emitting groove is located between the cooling grooves, such that the laser diode bar is located between the coolant spaces and such that heat will be transferred in a direction parallel to the major surface from the first side of the laser diode bar to one of the coolant spaces and from the second side of the laser diode bar to the other of the coolant spaces.

2. The laser diode apparatus according to claim 1, wherein a metallization layer is formed on the side walls of the heat-emitting groove.

3. The laser diode apparatus according to claim 1, wherein a metallization layer is formed on the sidewalls of the cooling grooves.

4. The laser diode apparatus according to claim 1, wherein the cooling groove is one of a plurality of cooling grooves through which coolant flows to cool the substrate, and the heat-emitting groove is one of a plurality of heat-emitting grooves in which laser diode bars are respectively located.

5. The laser diode apparatus according to claim 1, wherein the laser diode apparatus includes a housing, and the housing includes a window that is opposed to an emitting face of the laser diode bar.

6. A laser diode apparatus comprising:
a substrate having first and second major surfaces;
a plurality of grooves formed in the first major surface of the substrate, wherein at least a first one of the plurality of grooves serves as a cooling channel through which coolant flows to cool the substrate; and
a laser diode bar located in at least a second one of the plurality grooves, wherein the first groove is in close proximity to the second groove; wherein
the apparatus includes a housing, wherein the housing includes a, window that is opposed to an emitting face of the laser diode bar, and
a space exists between the laser diode apparatus and the housing, coolant flows through the space, and the space communicates with the cooling channel.

7. The laser diode apparatus according to claim 6, wherein an inlet is formed in the housing to conduct coolant into the housing, and an outlet is formed in the housing for permitting coolant to exit the housing.

8. The laser diode apparatus according to claim 7, wherein the inlet is located on a first side of the housing, the outlet is located on a second side of the housing, which is opposite to the first side of the housing, and the substrate is arranged in the housing such that the grooves extend from the first side of the housing to the second side of the housing and such that the cooling channel is aligned with the direction of coolant flow.

9. A method of forming monolithic laser diode arrays, the method comprising:
providing a monolithic substrate;
forming a row of substantially identical, parallel grooves in a major surface of the substrate, such that grooves are spaced apart at regular intervals, wherein a set of three neighboring ones of the grooves includes a heat-emitting groove and a pair of cooling grooves;
forming side walls of the grooves vertically in the monolithic substrate, such that each side wall is perpendicular to the major surface and such that each groove has an opening in the major surface; and
setting a laser diode bar in the heat-emitting groove, such that a radiation emitting surface of the laser diode bar is parallel to the major surface of the substrate, wherein the laser diode bar has a pair of sides, which are opposite to and parallel to one another, and wherein each of the sides of the laser diode bar is perpendicular to the radiation-emitting surface, and the opposite sides of the laser diode bar contact corresponding side walls of the heat-emitting groove; and
leaving the cooling grooves open to define coolant spaces that accommodate a cooling fluid to facilitate heat transfer from the laser diode bar, wherein the laser diode bar is located between the coolant spaces, such that heat will be transferred in a direction parallel to the first major surface from the laser diode bar to the coolant spaces and such that the coolant spaces are located in a direction that is perpendicular to the side walls of the grooves from any point on the sides of the laser diode bars.

10. The method as claimed in claim 9, wherein the method includes forming a plurality of grooves that includes the heat-emitting groove and the cooling grooves, such that the heat-emitting groove is one of a plurality of heat-emitting grooves that hold laser diodes, and the cooling grooves are included in a plurality of vacant grooves, wherein the vacant cooling grooves are alternated with the heat-emitting grooves that hold laser diodes.

11. The laser diode apparatus according to claim 1, wherein the laser diode bars are arranged such that the entirety of each laser diode bar is located between the cooling channels and such that the distance between the laser diode bar and the nearest cooling channel is the same for any point on the laser diode bar.

12. The laser diode apparatus according to claim 1, wherein the apparatus includes a housing, a space is formed between the substrate and the housing, and the space communicates with the interior of the cooling grooves, such that the cooling fluid can flow from the space to the cooling grooves.

13. The laser diode apparatus according to claim 1, wherein the cooling grooves are unobstructed such that the cooling fluid can contact the entirety of the sidewalls of the cooling grooves from the major surface to the bottoms of the cooling grooves.

14. The laser diode apparatus according to claim 1, wherein the cooling grooves are located such that a line extending perpendicularly from any point on the first side or the second side of the laser diode bar will pass through the coolant space of a corresponding one of the cooling grooves.

15. The laser diode apparatus according to claim 1, wherein the coolant spaces are located in a direction that is perpendicular to the sides of the laser diode bars from any point on the sides of the laser diode bars.

16. The laser diode apparatus according to claim 1, wherein the coolant spaces extend in a depth direction from the major surface to at least the depth of the laser diode bar.

17. The laser diode apparatus according to claim 1, wherein the grooves are spaced apart at regular intervals.

18. The laser diode apparatus according to claim 1, wherein the laser diode bar is located between the coolant spaces such that each entire side of the laser diode bar faces the coolant space of a corresponding one of the cooling grooves, and the distance to the nearest one of the coolant spaces from any point on the first aide of the laser diode is uniform, and the distance to the nearest one of the coolant spaces from any point on the second side of the laser diode is uniform.

* * * * *